United States Patent [19]
Ghoshal

[11] Patent Number: 5,912,596
[45] Date of Patent: Jun. 15, 1999

[54] APPARATUS AND METHOD FOR FREQUENCY TUNING AN LC OSCILLATOR IN A INTEGRATED CLOCK CIRCUIT

[75] Inventor: Uttam Shymalindu Ghoshal, Austin, Tex.

[73] Assignee: International Business Machines Corporation, Armonk, N.Y.

[21] Appl. No.: 09/013,280

[22] Filed: Jan. 26, 1998

[51] Int. Cl.$^6$ .................................................. H03B 5/02
[52] U.S. Cl. .............................. 331/117 R; 331/108 B; 331/108 C; 331/117 R; 331/167; 331/45; 331/48; 331/74
[58] Field of Search .......................... 331/108 C, 117 FE, 331/113 R, 45, 177 R, 181, 177 V, 135, 108 B, 117 R, 48, 167

*Primary Examiner*—Arnold Kinkead
*Attorney, Agent, or Firm*—Casimer K. Salys; Andrew J. Dillon

[57] ABSTRACT

A method and system in an integrated circuit for frequency tuning oscillator circuits. An oscillator circuit within an integrated circuit is formed on a substrate such that the oscillator circuit is coupled to an inductor component. The inductor component includes a first inductor positioned parallel to a second inductor such that a total effective inductance is associated with the first and second inductors. The first inductor is formed from a first spiral coil layer which is coupled to a second spiral coil layer on the substrate. The second inductor is formed of a single spiral coil layer on the substrate, wherein the single spiral coil layer provides an inductive feedback signal to the oscillator circuit when electrical current flows through the single spiral coil layer in response to current flowing through the first spiral coil layer and the second spiral coil layer. The feedback signal can be adjusted such that a change in a phase associated with the feedback signal results in an alteration of the total effective inductance, which in turn shifts a center frequency associated with the oscillator circuit thereby promoting frequency tuning of the oscillator circuit over a wide tuning range. In addition, a capacitor component can be connected to the oscillator circuit such that the capacitor component includes two series connected capacitors which have an associated effective capacitance. A change in the effective capacitance also results in a shift in the center frequency.

13 Claims, 7 Drawing Sheets

APPARATUS AND METHOD FOR FREQUENCY TUNING AN LC OSCILLATOR IN A INTEGRATED CLOCK CIRCUIT

BACKGROUND OF THE INVENTION

1. Technical Field

The present invention relates in general to digital and analog oscillator circuits. In particular, the present invention relates to tunable clock oscillators for digital circuits. Still more particularly, the present invention relates to tunable LC oscillator devices utilized in digital clock circuits.

2. Description of the Related Art

In fabricating clock oscillator circuits utilized in digital circuits, it is often necessary to fabricate circuits which are tunable, such as circuits in which the center frequency may be altered. At high frequencies, oscillators based on LC circuits are preferred for reducing jitter and for scaling the power supply voltages. A tunable circuit contains some form of tuning so that the natural resonant frequency associated with the circuit may be varied. In such a circuit, the resonance condition of forced oscillations can be altered. Tuning may be carried out by adjusting the value of the capacitance or the inductance, or both.

An LC oscillator is a type of harmonic oscillator. Harmonic oscillators generate waveforms that are sinusoidal in nature and contain one or more active circuit elements that function to continuously supply power to passive components associated with the LC oscillator. A simple harmonic oscillator is typically composed of a frequency determining device, such as a resonant circuit, and an active element that supplies direct power to the resonant circuit and which also compensates for damping which occurs as a result of resistive losses. The resonant circuit contains both inductance and capacitance arranged in a manner such that the circuit is capable of generating resonant frequencies, depending on the value of the circuit elements and their particular arrangement.

In the case of a simple LC oscillator, application of a direct voltage causes free oscillations in the circuit which eventually decay because of the inevitable resistance in the circuit. Thus, an LC oscillator is essentially a tunable circuit that contains both inductance (L) and capacitance (C). The product, (LC), determines the center frequency of oscillation. The center frequency ($\omega_o$) is represented by the following equation:

$$\omega_o = \frac{1}{\sqrt{LC}}$$

These type of oscillator circuits are particularly important in synchronizing multiple processors such as those utilized in four-way or eight-way computer systems, well known in the art of digital and computer electronics. For a given computer system to operate properly, each processor must have an identical center frequency. Due to process conditions, one processor clock may differ from another processor clock.

Even if such processor clocks are similar in structure and design, the oscillators upon which such clocks are based must be fine tuned in order to maintain an exact frequency match.

Without an exact frequency match, phase slippage results over time. In configurations in which voltage controlled oscillators and LC oscillators are utilized, it is necessary to maintain continuous frequency tuning of the voltage controlled oscillator and the LC oscillator, in order for the configuration to be practical in operation.

There are a number of methods which exist for tuning such circuits. For example, for one-time tuning, tuning can be accomplished utilizing wired fuses or focused ion beam tailoring, techniques well-known in the art. A particular tuning element also well known in the art is a reverse biased diode. When a diode is reverse biased, an associated capacitance is subsequently altered. This capacitance can be part of the C of an LC resonator. Such diodes have a very limited tuning range, usually a range of approximately 15%. When zero voltage occurs across the diode, the depletion capacitance is reduced approximately by an amount represented by the following equation:

$$\frac{C_{jo}}{\sqrt{2\phi_B + V_{DD}}}$$

In this equation, $\phi_B$ represents bulk potential. The limited tuning range implies targeting a center frequency perfectly, which is a difficult task to accomplish. In a very narrow band system that does not include multiple processors, a limited tuning range may be adequate, but for most systems, such a limited tuning range is inadequate.

Based on the foregoing, it can be appreciated that a need exists for a method and system which would allow a user to fine tune the frequency of an LC oscillator in a digital circuit clock. A need also exists to allow a wide range of tuning for such LC oscillators. Because a wide range of tuning is not currently feasible with current devices, applicability is limited to uniprocessor devices. A device, such as the one disclosed herein, not only solves processor problems associated with LC oscillators requiring a wide tuning range, but is also applicable to technological areas outside the processor arena. For example, such a device would also be advantageous in analog situations and technological areas such as wireless and communication networks. A device that allows fine tuning of clock oscillators would be welcomed by those in the industry currently limited in synchronizing circuits driven by current clock oscillator devices.

SUMMARY OF THE INVENTION

It is therefore one object of the present invention to provide improved digital and analog oscillator circuits.

It is therefore another object of the present invention to provide improved tunable clock oscillators for digital circuits.

It is yet another object of the present invention to provide an improved LC oscillator device utilized in digital circuit clocks.

It is still another object of the present invention to provide a method and system for tuning an LC oscillator utilized in a digital circuit clock.

The above and other objects are achieved as is now described. A method and system in an integrated circuit for frequency tuning oscillator circuits are disclosed. An oscillator circuit within an integrated circuit is formed on a substrate such that the oscillator circuit is coupled to an inductor component. The inductor component includes a first inductor positioned parallel to a second inductor such that a total effective inductance is associated with the first and second inductors. The first inductor is formed from a first spiral coil layer which is coupled to a second spiral coil layer on the substrate. The second inductor is formed of a single spiral coil layer on the substrate, wherein the single spiral coil layer provides an inductive feedback signal to the oscillator circuit when electrical current flows through the single spiral coil layer in response to current flowing through the first spiral coil layer and the second spiral coil layer. The feedback signal can be adjusted such that a change in a phase associated with the feedback signal results in an alteration of the effective inductance, which in turn shifts a center frequency associated with the oscillator circuit, thereby promoting frequency tuning of the oscillator circuit over a wide tuning range. In addition, a capacitor component can be connected to the oscillator circuit such that the capacitor component includes two series connected capacitors which have an associated total effective capacitance. A change in the total effective capacitance also results in a shift in the center frequency.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of a preferred embodiment when read in conjunction with the accompanying drawings, wherein

DETAILED DESCRIPTION OF PREFERRED EMBODIMENT

Figure 1:
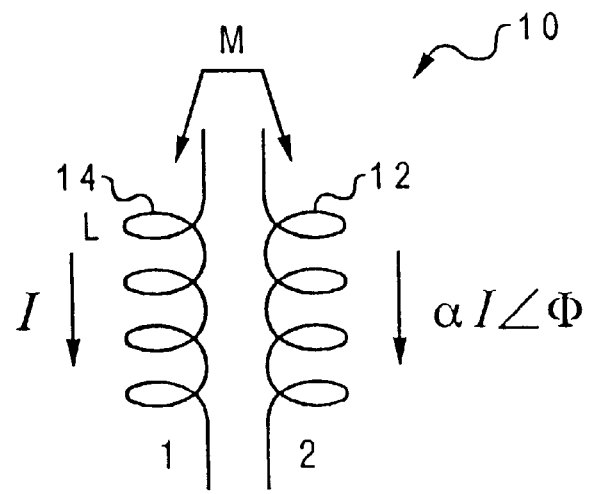
FIG. 1 illustrates a schematic diagram depicting two coils and their associated effective inductance.

With reference now to the figures and in particular with reference to FIG. 1, there is depicted a schematic diagram depicting two inductors and an associated total effective inductance. In a configuration 10 composed of inductor 14 and inductor 12, the total effective inductance is given by equation 16 below. Inductor 14 and inductor 12 are inductors, which are circuit elements based on phenomena associated with magnetic fields. A time-varying magnetic field induces a voltage in any conductor that is linked to the field. The circuit parameter of inductance thus relates the induced voltage to the current. The effective inductance $L_{eff}$ is thus provided by the following equation, where $L_{eff}$ varies in a range $(L \pm \alpha M)$ by changing the phase $\emptyset$:

$$L_{eff} = L + \alpha M e^{j\emptyset} \quad \text{(Equation 1)}$$

In equation 1 provided above, $\alpha$ represents an amplitude control factor and $\emptyset$ is a phase control factor. M represents mutual inductance. L is simply the self inductance associated with an inductor.

Figure 2:
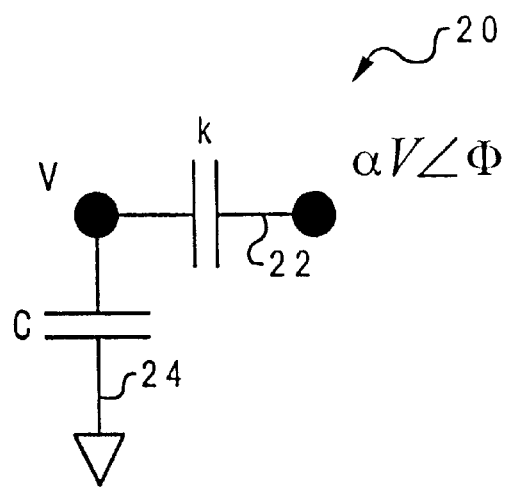
FIG. 2 depicts a schematic diagram illustrating two capacitors and their associated effective capacitance.

Those skilled in the art will appreciate that an analogous configuration is available for capacitors. For example, FIG. 2 depicts a schematic diagram illustrating two capacitors and their associated effective capacitance. In FIG. 2, a two capacitor configuration 20 is presented. The two capacitor configuration 20 is composed of capacitor 22 coupled to capacitor 24, which results in an effective capacitance, as illustrated by equation 2. Capacitors are circuit elements based on phenomena associated with electric fields. The source of the electric field is separation of charge, or voltage.

If the voltage varies with time, the electric field consequently varies with time. A time-varying electric field produces a displacement current in the space occupied by the field. The circuit parameter of capacitance relates the displacement current to the voltage, such that the displacement current is equivalent to the conduction current at the terminals of the capacitor. The effective capacitance $C_{eff}$ varies between $(C \pm \alpha k)$ by changing the phase $\emptyset$. The effective capacitance $C_{eff}$ is represented by equation 2 below:

$$C_{eff} = C^{-\alpha} k e^{j\emptyset} \quad \text{(Equation 2)}$$

In an LC oscillator circuit, a center frequency can thus be calculated based on the effective inductances and capacitances available for that particular oscillator circuit. Those skilled in the art will appreciate that the center frequency $\omega_o$ is represented by the following equation:

$$\omega_o = \frac{1}{\sqrt{L_{eff} C_{eff}}}$$

Figure 3A:
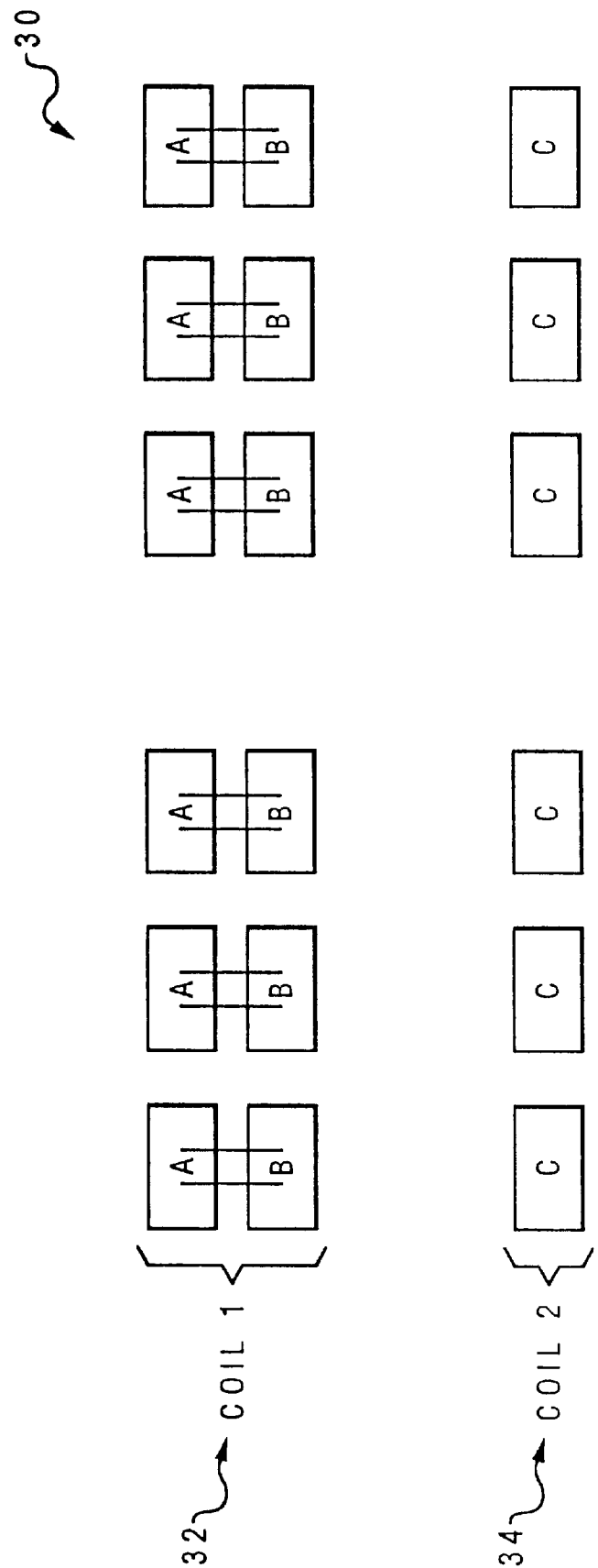
FIG. 3(a) illustrates a cross-section view of an inductor circuit which utilizes inductor feedback, in accordance with a preferred embodiment of the present invention.

FIG. 3(a) illustrates a cross-section view of an inductor circuit 30 which utilizes inductor feedback, in accordance with a preferred embodiment of the present invention. In FIG. 3(a), two inductors are presented, a first inductor 32 and a second inductor 34. First inductor 32 is composed of an additional inductor. Two layer spiral coils connected in parallel are utilized to form first inductor 32 in order to reduce the coil resistance of first inductor 32. These layers are indicated respectively by letter A and letter B. Second inductor 34 forms a feedback inductor constructed from a single spiral coil which is represented in FIG. 3(a) as letter C. Thus, two windings form first inductor 32, while a single winding forms second inductor 34.

Figure 3B:
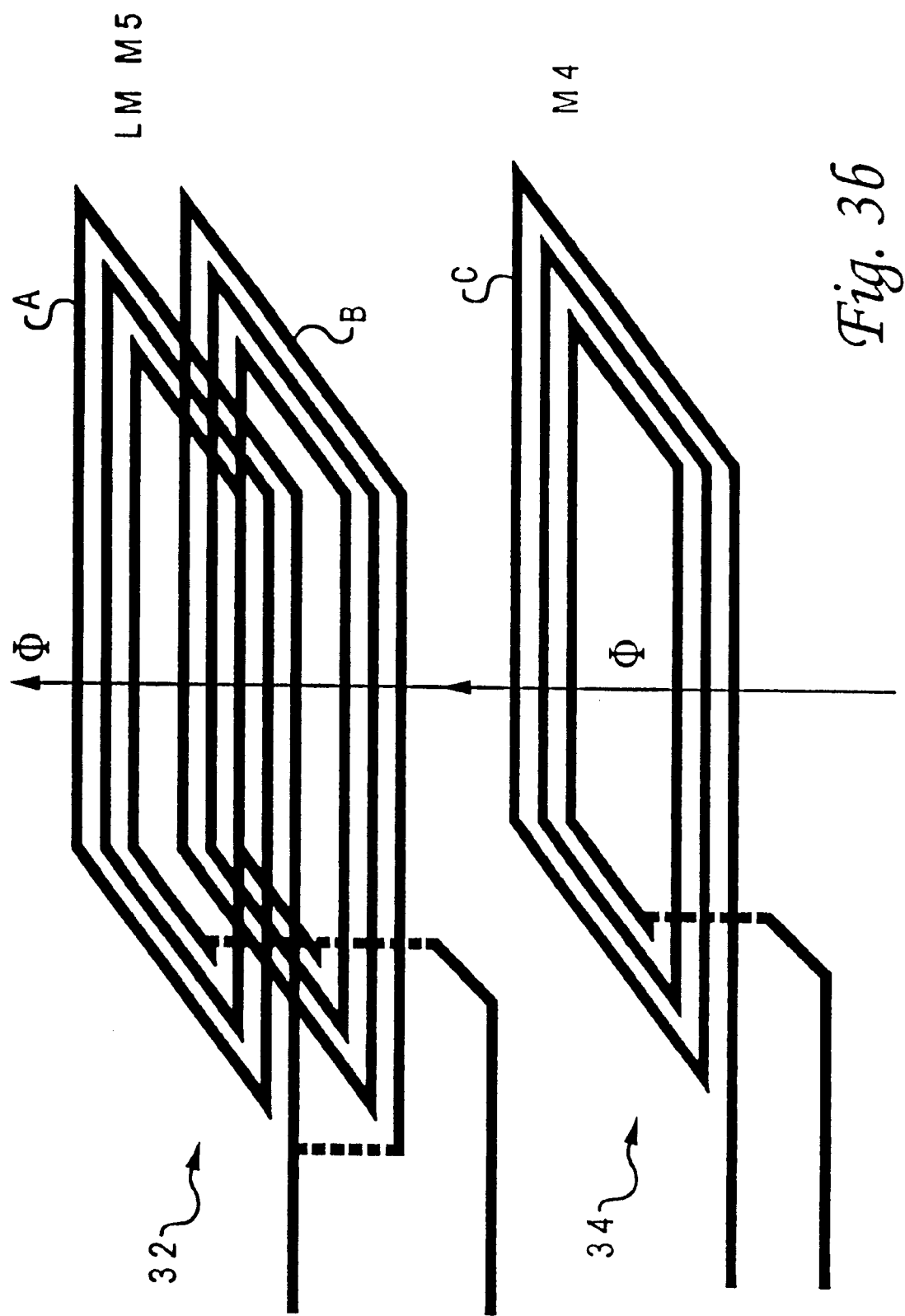
FIG. 3(b) illustrates a side view of the inductor circuit, in accordance with a preferred embodiment of the present invention.

As the phase of the feedback signal provided by the configuration presented in FIG. 3(a) is altered, the effective inductance and center frequency are altered according to the aforementioned equations. FIG. 3(b) illustrates a side view of the inductor circuit 30 of FIG. 3(a), in accordance with a preferred embodiment of the present invention. In FIG. 3(a) and FIG. 3(b) like parts are indicated by like reference numerals. Those skilled in the art will appreciate that the configuration described in FIG. 3(b) depicts a layered view of inductors 32 and 34 that may be implemented as physical inductors on a silicon wafer.

Those skilled in the art can also appreciate that based on the configuration of FIG. 3(b), flux generates a coupled field because the inductors are located physically one below the other, much in the same way as two or more coils positioned in parallel to one another. However, as will be explained momentarily, in order to implement the inductors in a preferred embodiment of the present invention and achieve multiple phases and a smooth interpolation, a phase interpolator and a four phase oscillator (0, 90, 180, 170) may be associated with these inductors.

Figure 4:
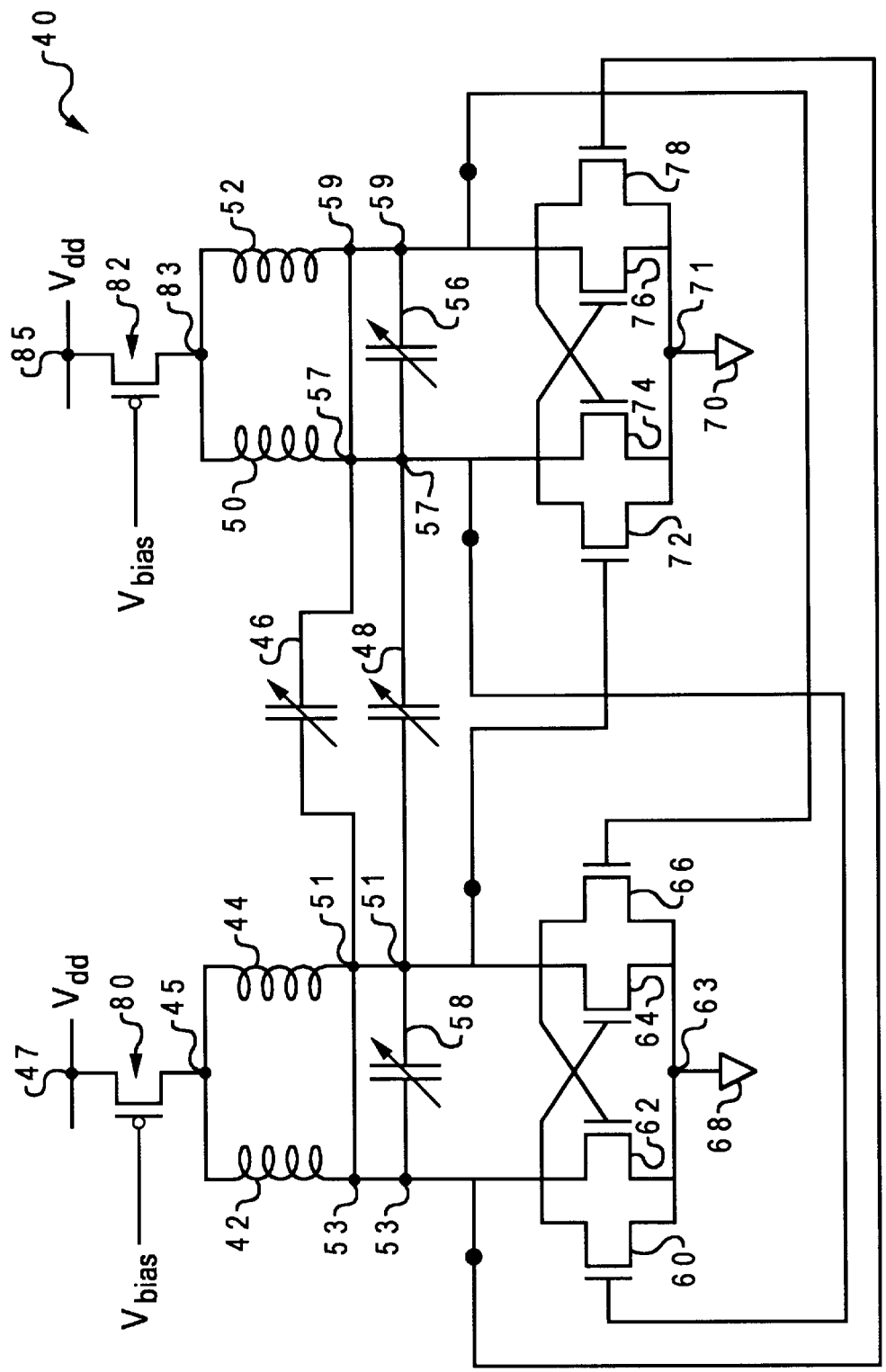
FIG. 4 depicts a schematic diagram illustrative of a quadrature oscillator circuit, in accordance with a preferred embodiment of the present invention.

FIG. 4 depicts a schematic diagram illustrative of a quadrature oscillator circuit which forms a quadrature oscillator 40 in accordance with a preferred embodiment of the present invention. Quadrature oscillator 40 comprises inductors 42, 44, 50, and 52 which are in turn connected to a bias network that includes transistors 80 and 82. The quadrature oscillator 40 follows the technique outlined in the text related to FIG. 3. Inductor 42 is connected to inductor 44 which are each connected to a transistor 80 at node 45. Transistor 80 is in turn connected to $V_{DD}$ at node 47. An adjustable capacitor 58 is positioned between node 53 and node 51 such that adjustable capacitor 58 is connected to inductor 42 at node 53 and to inductor 44 at node 51. A $V_{bias}$ voltage is applied to the gate of transistor 80 and to the gate of transistor 82. Capacitors 58, 48, 56 and 46 may be tunable capacitors.

Transistor 62 is connected to adjustable capacitor 58 and inductor 42 at node 53. Transistor 64 is connected to inductor 44 and adjustable capacitor 58 at node 51. The gate of transistor 62 is also connected to node 51. Transistor 60 is connected in parallel to transistor 62, while transistor 66 is connected in parallel to transistor 64. Transistors 60, 62, 64 and 66 are also connected to ground 68 at node 63.

Inductor 50 is connected to inductor 52. Each of these inductors are in turn each connected to a transistor 82 at node 83. Transistor 82 is connected to voltage supply $V_{DD}$ at node 85. An adjustable capacitor 56 is positioned between node 57 and node 59 such that adjustable capacitor 56 is connected to inductor 52 at node 59 and to inductor 50 at node 57. Transistor 74 is connected to adjustable capacitor 56 and inductor 50 at node 57.

Transistor 76 is connected to inductor 52 and adjustable capacitor 56 at node 59. The gate of transistor 74 is also coupled to node 59. Transistor 72 is connected in parallel to transistor 74, while transistor 78 is connected in parallel to transistor 76. Transistors 72, 74, 76 and 78 are also connected to ground 70 at node 71. Voltage phases (0, 90, 180, and 270 degrees) are respectively generated at node 53, 57, 51, and 59.

Figure 5A:
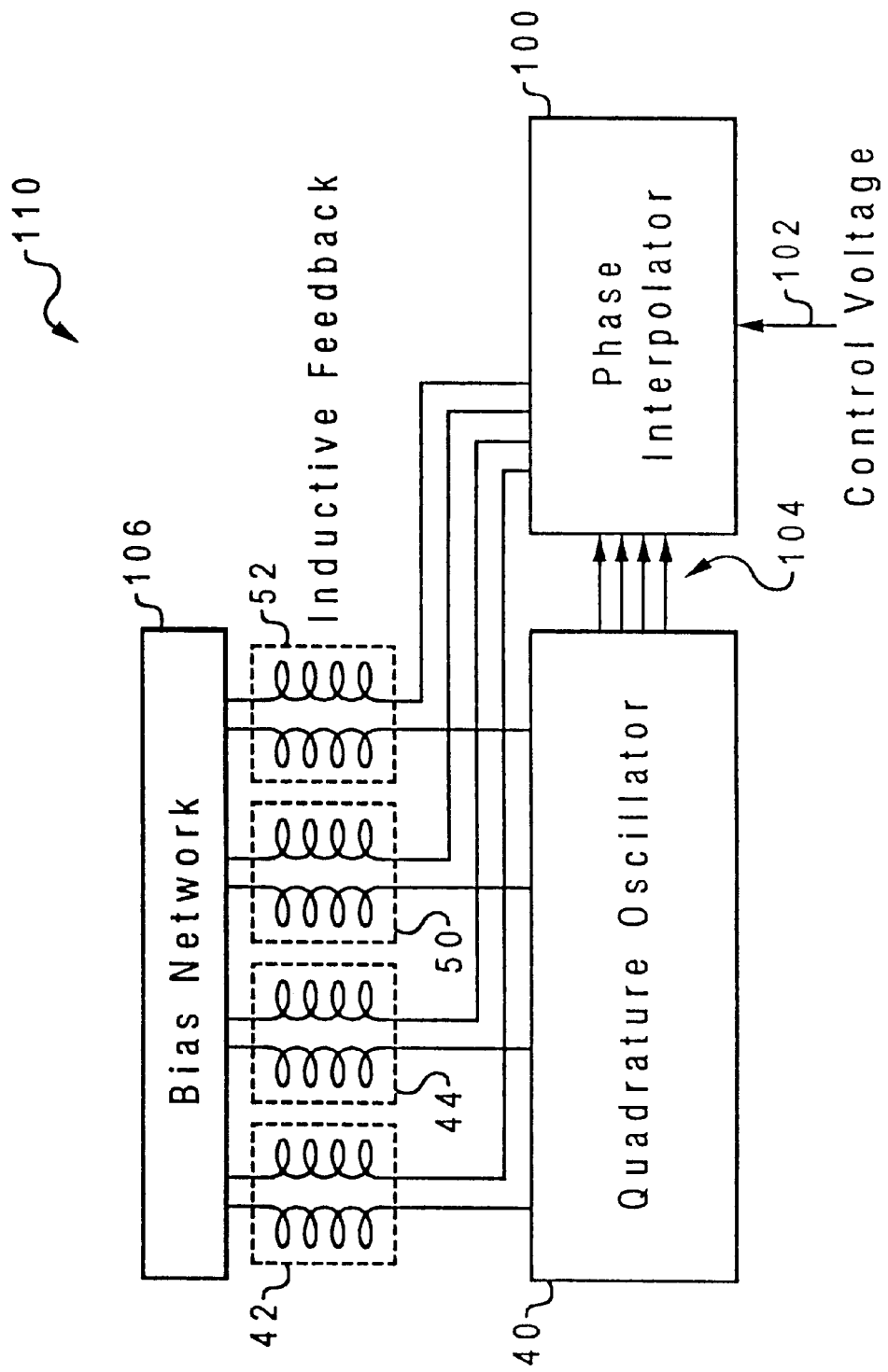
FIG. 5(a) depicts a block diagram of a circuit 110 that provides frequency tuning by phase interpolation, in accordance with a preferred embodiment of the present invention.

FIG. 5(a) depicts a block diagram of a circuit 110 that provides frequency tuning by phase interpolation, in accordance with a preferred embodiment of the present invention. Circuit 110 includes quadrature oscillator 40, which is an implementation of quadrature oscillator 40 depicted in FIG. 4. In FIG. 5(a), dashed lines respectively surround inductors 42, 44, 50 and 52 which are analogous to inductors 42, 44, 50 and 52 of FIG. 4. Those skilled in the art will appreciate that each inductor actually is composed of two inductors, which are analogous to the inductors described in FIG. 3(a) and FIG. 3(b). Each inductor provides inductive feedback as described herein.

Inductors 42, 44, 50 and 52 are connected to bias network 106 and to quadrature oscillator 40 and phase interpolator 100. Phase interpolator 102 is also tied to control voltage 102. Output 104 is provided from quadrature oscillator 40 to phase interpolator circuit 100. Output 104 consists of four signal phases (0, 90, 180, and 270 degrees) from quadrature oscillator 40. Those skilled in the art will appreciate that based on the implementation depicted in FIG. 5(a), four phases are necessary to interpolate and generate a variable phase between 0 and 360 degrees. Thus, phase interpolator circuit 100, which generates four phases 0, 90, 180 and 270, can generate any phase in the range 0 to 270 degrees. Phase interpolator circuit 100 takes the four phases at a time and via a voltage control circuit, interpolates between these phases.

Figure 5B:
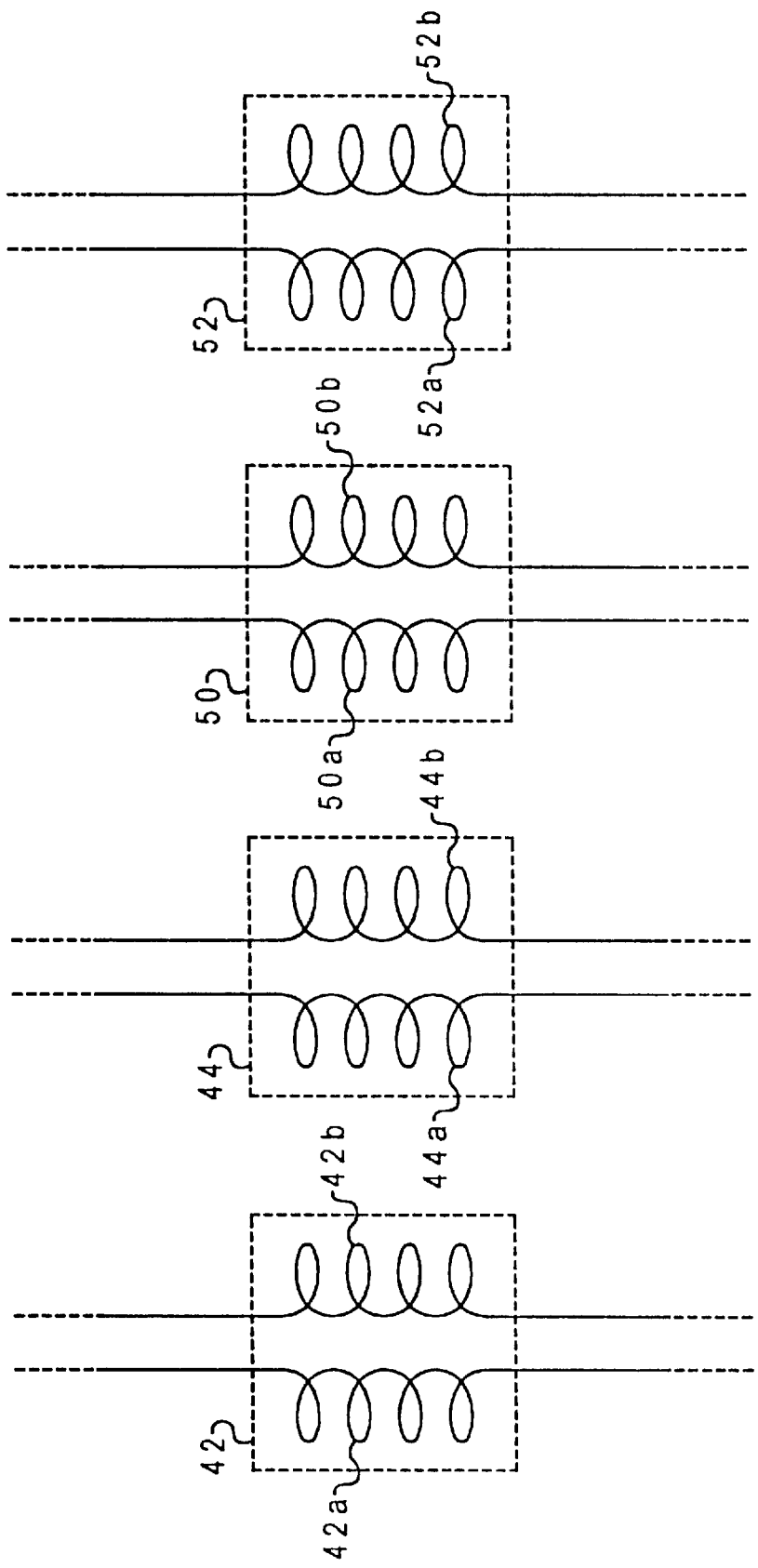
FIG. 5(b) is a partial detailed illustration of the inductors depicted in FIG. 5(a), in accordance with a preferred embodiment of the present invention.

FIG. 5(b) is a partial detailed illustration of the inductors depicted in FIG. 5(a), in accordance with a preferred embodiment of the present invention. Inductor 42 is composed of inductors 42a and 42b. Inductor 44 is composed of inductors 44a and 44b, while inductor 50 is composed of inductors 50a and 50b. Inductor 52 is composed of inductors 52a and 52b. The inductors operate according to the principals related to the text describing FIG. 1 to FIG. 3(b) herein. Thus, for example, inductors 44a and 44b are respectively analogous to inductors 32 and 34 depicted in FIG. 3(a) and FIG. 3(b).

Figure 6A:
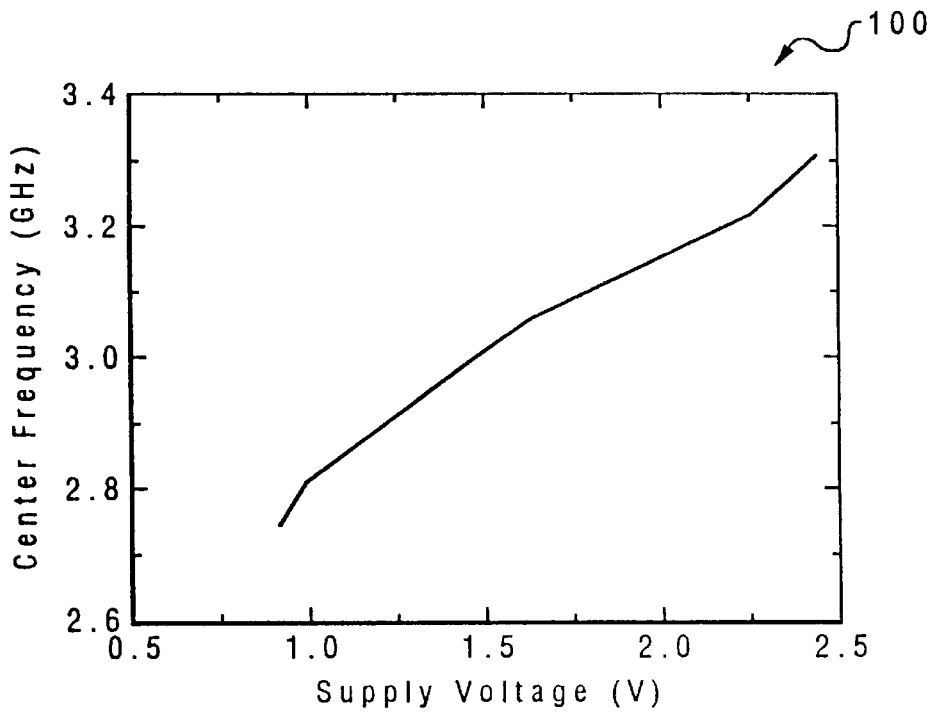
FIG. 6(a) depicts a performance chart of quadrature oscillator performance, including supply voltage, in accordance with a preferred embodiment of the present invention.
Figure 6B:
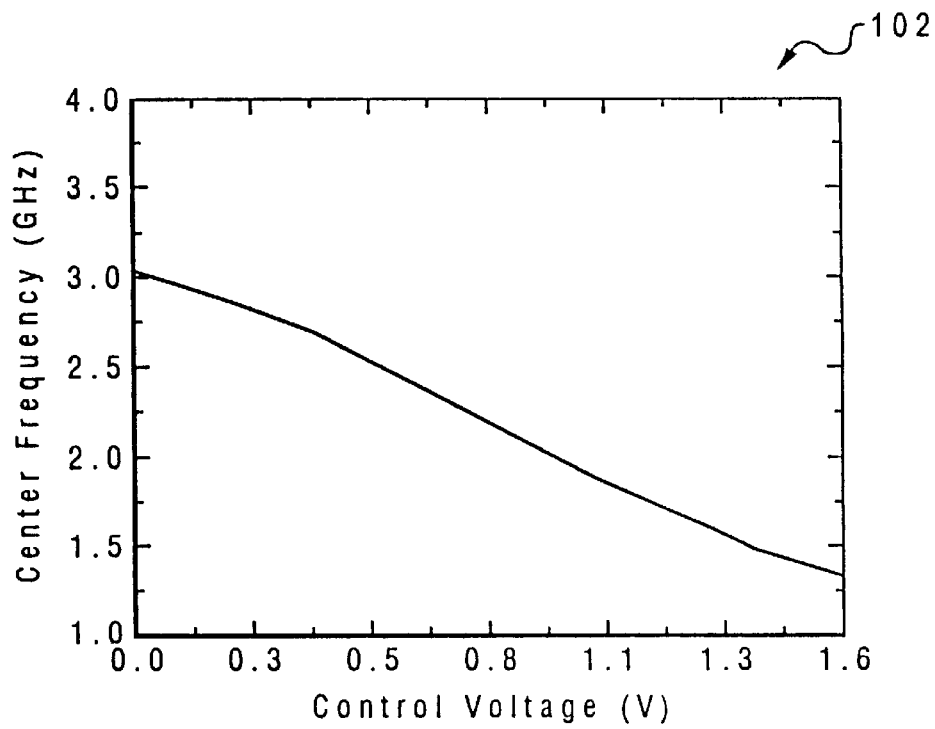
FIG. 6(b) illustrates a performance chart of quadrature oscillator performance, including control voltage, in accordance with a preferred embodiment of the present invention.

FIG. 6(a) depicts a performance chart 100 of quadrature oscillator performance, including supply voltage, in accordance with a preferred embodiment of the present invention. FIG. 6(b) illustrates a performance chart 102 of quadrature oscillator performance, including control voltage, in accordance with a preferred embodiment of the present invention. FIG. 6(a) and FIG. 6(b) demonstrate the performance of an actual embodiment of the present invention where voltage is controlled from 0 to 1.6 volts in order to alter the center frequency from three gigahertz to about 1.3 gigahertz. Those skilled in the art will appreciate, based on these performance charts, that a wide tuning range is indicated. Given a wide tuning range such as the one indicated herein, those skilled in the art can appreciate that a clock oscillator circuit based on the aforementioned LC oscillator circuit configuration provides an electronics user with the ability to fine tune digital circuits incorporating such LC oscillators.

The embodiments and examples set forth herein are presented in order to best explain the present invention and its practical application and, thereby, to enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A system in an integrated circuit for frequency tuning oscillator circuits, comprising:

an oscillator circuit within an integrated circuit formed on a substrate, said oscillator circuit coupled to an inductor component;

said inductor component comprising a first inductor positioned parallel to a second inductor such that a total effective inductance is associated with said first and second inductors;

said first inductor comprising a first spiral coil layer coupled to a second spiral coil layer on said substrate;

said second inductor comprising a single spiral coil layer on said substrate, wherein said single spiral coil layer provides an inductive feedback signal to said oscillator circuit when electrical current flows through said single spiral coil layer in response to current flowing through said first spiral coil layer and said second spiral coil layer; and means for adjusting said feedback signal such that a change in a phase associated with said feedback signal results in an alteration of said total effective inductance, which in turn shifts a center frequency associated with said oscillator circuit thereby promoting frequency tuning of said oscillator circuit over a wide tuning range.

2. The system of claim 1 wherein said oscillator circuit comprises a quadrature oscillator circuit.

3. The system of claim 2 wherein said quadrature oscillator circuit is coupled to a phase interpolator circuit.

4. The system of claim 3 wherein said quadrature oscillator circuit is coupled to an inductive feedback network comprising four of said inductor components.

5. The system of claim 4 wherein said inductive feedback network is further coupled to a voltage bias network.

6. The system of claim 1 wherein said oscillator circuit comprises an oscillator circuit coupled to a capacitor component, said capacitor component comprising:

a first capacitor positioned in series with a second capacitor such that an effective capacitance is associated with said first and second capacitors; and means for adjusting a feedback signal associated with said first and second capacitors such that a change in a phase associated with said feedback signal results in an alteration of said effective capacitance, which in turn shifts a center frequency associated with said oscillator circuit thereby promoting frequency tuning of said oscillator circuit over a wide tuning range.

7. A method in an integrated circuit for frequency tuning oscillator circuits, comprising the steps of:

providing an oscillator circuit within an integrated circuit formed on a substrate, wherein said oscillator circuit is coupled to an inductor component;

positioning within said inductor component a first inductor parallel to a second inductor such that a total effective inductance is associated with said first and second inductors;

constructing said first inductor from a first spiral coil layer coupled to a second spiral coil layer on said substrate;

constructing said second inductor from a single spiral coil layer on said substrate, wherein said single spiral coil layer provides an inductive feedback signal to said oscillator circuit when electrical current flows through said single spiral coil layer in response to current flowing through said first spiral coil layer and said second spiral coil layer; and adjusting said feedback signal such that a change in a phase associated with said feedback signal results in an alteration of said total effective inductance, which in turn shifts a center frequency associated with said oscillator circuit thereby promoting frequency tuning of said oscillator circuit over a wide tuning range.

8. The method of claim 7 wherein the step of providing an oscillator circuit within an integrated circuit formed on a substrate, wherein said oscillator circuit is coupled to an inductor component, further comprises the step of:

providing an oscillator circuit within an integrated circuit formed on a substrate, wherein said oscillator circuit is coupled to an inductor component, such that said oscillator circuit comprises a quadrature oscillator circuit.

9. The method of claim 8 further comprising the step of coupling a phase interpolator circuit to said quadrature oscillator circuit.

10. The method of claim 9 further comprising the step of connecting to said quadrature oscillator circuit, an inductive feedback network comprising four of said inductor components.

11. The method of claim 10 further comprising the step of coupling said inductive feedback network to a voltage bias network.

12. The method of claim 7 wherein the step of providing an oscillator circuit within an integrated circuit formed on a substrate, wherein said oscillator circuit is coupled to an inductor component, further comprises the step of:

providing an oscillator circuit within an integrated circuit formed on a substrate, wherein said oscillator circuit is coupled to a capacitor component.

13. The method of claim 12 further comprising the steps of:

positioning a first capacitor in series with a second capacitor to form said capacitor component such that an effective capacitance is associated with said first and second capacitors; and adjusting a feedback signal associated with said first and second capacitors such that a change in a phase associated with said feedback signal results in an alteration of said effective capacitance, which in turn shifts a center frequency associated with said oscillator circuit thereby promoting frequency tuning of said oscillator circuit over a wide tuning range.

* * * * *